(12) United States Patent
Chittipeddi et al.

(10) Patent No.: US 6,294,807 B1
(45) Date of Patent: Sep. 25, 2001

(54) SEMICONDUCTOR DEVICE STRUCTURE INCLUDING A TANTALUM PENTOXIDE LAYER SANDWICHED BETWEEN SILICON NITRIDE LAYERS

(75) Inventors: Sailesh Chittipeddi, Allentown; Charles Walter Pearce, Emmaus, both of PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/259,001

(22) Filed: Feb. 26, 1999

(51) Int. Cl.[7] .................. H01L 27/108; H01L 29/76; H01L 29/94; H01L 31/119; H01L 29/00
(52) U.S. Cl. .................. 257/310; 257/295; 257/501; 257/506
(58) Field of Search .................. 257/295, 310, 257/501, 506

(56) References Cited

U.S. PATENT DOCUMENTS

| | | |
|---|---|---|
| 5,147,820 | 9/1992 | Chittipeddi et al. . |
| 5,256,455 | 10/1993 | Numasawa . |
| 5,256,588 * | 10/1993 | Witek et al. .................. 437/52 |
| 5,279,985 | 1/1994 | Kamiyama . |
| 5,352,623 | 10/1994 | Kamiyama . |
| 5,438,012 | 8/1995 | Kamiyama . |
| 5,486,488 | 1/1996 | Kamiyama . |
| 5,508,221 | 4/1996 | Kamiyama . |
| 5,543,345 * | 8/1996 | Liaw et al. .................. 437/52 |
| 5,619,051 | 4/1997 | Endo . |
| 5,672,891 * | 9/1997 | Hamamoto et al. .................. 257/301 |
| 5,696,017 | 12/1997 | Ueno . |
| 5,714,790 * | 2/1998 | Sakamoto .................. 257/440 |
| 5,763,315 | 6/1998 | Benedict et al. . |
| 5,801,079 | 9/1998 | Takaishi . |
| 5,805,494 | 9/1998 | Ei-Kareh et al. . |
| 5,807,760 | 9/1998 | Buckfeller et al. . |
| 5,811,336 | 9/1998 | Kasai . |
| 5,854,114 | 12/1998 | Li et al. . |
| 5,856,009 | 1/1999 | Nishio et al. . |
| 5,858,873 | 1/1999 | Vitgavage et al. . |

* cited by examiner

Primary Examiner—Eddie Lee
Assistant Examiner—Jesse A. Fenty
(74) Attorney, Agent, or Firm—Duane, Morris & Heckscher LLP

(57) ABSTRACT

An insulating structure includes a first silicon nitride layer, a tantalum pentoxide layer formed above the first silicon nitride ($SiN_x$) layer, and a second silicon nitride layer formed above the tantalum pentoxide ($Ta_2O_5$) layer. The $SiN_x$ cladding layers prevent difflusion of the tantalum during heating. A high dielectric constant is provided. The thermal stability of the insulating structure is improved. The insulating structure may be included in a capacitor or a shallow trench isolation structure. An exemplary capacitor is formed with a substrate, a lower electrode, the three-layer $Si_xN_y/Ta_2O_5/Si_xN_y$ structure and an upper electrode. The lower electrode may include a TiN layer formed over an aluminum layer, or a TiN layer formed over a polysilicon layer, or a polysilicon layer having an oxide barrier layer formed on it. The upper electrode may be a TiN layer or a polysilicon layer. An exemplary shallow trench isolation structure includes the $Si_xN_y/Ta_2O_5/Si_xN_y$ structure as a liner on the sides and bottom of a shallow trench in the surface of a substrate. The shallow trench is filled with an oxide, such as TEOS. A variety of methods may be used for fabricating devices that include the $Si_xN_y/Ta_2O_5/Si_xN_y$ structure.

5 Claims, 2 Drawing Sheets

SEMICONDUCTOR DEVICE STRUCTURE INCLUDING A TANTALUM PENTOXIDE LAYER SANDWICHED BETWEEN SILICON NITRIDE LAYERS

CROSS-REFERENCE TO RELATED APPLICATIONS

This application is related to, and claims priority of, co-pending U.S. application Ser. No. 09/259,001 filed Feb. 26, 1999, entitled SEMICONDUCTOR DEVICE STRUCTURE INCLUDING A TANTALUM PENTOXIDE LAYER SANDWICHED BETWEEN SILICON NITRIDE LAYERS.

FIELD OF THE INVENTION

The present invention relates to integrated circuit devices and methods for fabricating an integrated circuit and, in particular, monolithic capacitors.

DESCRIPTION OF THE RELATED ART

Research has focussed on finding an insulating film having a high dielectric constant suitable for use in capacitor elements, such as capacitor elements of memory cells in dynamic random access memory (DRAM) devices or other memory devices.

Of the insulating films having high dielectric constants, a tantalum pentoxide ($Ta_2O_5$) film formed by chemical vapor deposition (CVD) has been intensely studied. This is because the tantalum pentoxide film has a large dielectric constant ranging from 25 to 30 and has excellent step-coverage characteristics compared to other dielectric materials, and is more easily deposited than other materials having a high dielectric constant.

U.S. Pat. Nos. 5,438,012 and 5,352,623 to Kamiyama (hereinafter, "the '012 patent" and "the '623 patent") and U.S. Pat. No. 5,696,017 to Ueno (hereinafter, "the '017 patent") are all incorporated by reference herein in their entireties, for their teachings on methods for forming a capacitor element within an integrated circuit, wherein tantalum pentoxide is used as the dielectric material for the capacitor insulator layer.

In the '012 patent, as shown in FIG. 4A a silicon nitride film 24 is formed on a polysilicon electrode 3 by a quick heat treatment using ammonia gas ($NH_3$). Then, as shown in FIG. 4B, an impurity-doped tantalum pentoxide ($Ta_2O_5$) film 5 is deposited by the CVD process. Subsequently, as shown in FIG. 4D, a titanium nitride (TiN) film 6 is formed as an upper electrode 6.

In the '623 patent, the surface of a polysilicon film 2 is subjected to rapid thermal nitriding (RTN) by lamp-annealing or lamp heating, through which the polysilicon surface is reacted with nitrogen to form a silicon nitride film ($SiN_x$). Then, a tantalum pentoxide film 11 is formed on the lower capacitor electrode 2 by plasma enhanced chemical vapor deposition. The tantalum pentoxide film 11 is densified by a thermal treatment in an oxidizing atmosphere using an electric furnace, then nitrided by a plasma treatment with ammonia by use of a plasma-ion generator. Then, a titanium nitride layer is formed as the upper capacitor electrode 3 on the tantalum pentoxide film 11.

The '017 patent teaches that in a capacitor having a tantalum pentoxide insulating layer, it is also acceptable to use W, Mo, TiW, Pt, WN, MoN, TiWN, WSi, WSiN etc., instead of TiN as the upper electrode metal.

Tantalum pentoxide, as deposited, has excellent dielectric properties. Experience in prior art devices shows that the Tantalum tends to diffuse into the surrounding layers during subsequent heat treatment, tantalum pentoxide tends to diffuse into the upper or lower layers of the device in which they are used. This may have adverse consequences due to the metal contaminants. Improved structures and methods for integrated circuit capacitors is desired.

SUMMARY OF THE INVENTION

The present invention is an insulating structure that includes: a first silicon nitride layer; a second silicon nitride layer separate from the first silicon nitride layer; and a tantalum pentoxide layer formed between the first and second silicon nitride layers. Other aspects of the present invention include semiconductor devices including the insulating structure, and a method of fabricating the insulating structure.

DETAILED DESCRIPTION

Figure 1:
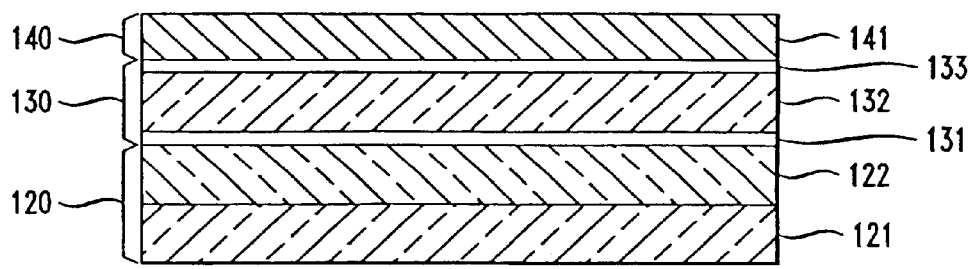
FIG. 1 illustrates a first exemplary device including an insulating structure according to the invention, wherein the device is a metal-oxide-metal (MOM) capacitor.

The present invention is an insulating structure which includes a tantalum pentoxide ($Ta_2O_5$) layer surrounded on both sides by silicon nitride (SiN) layers, and a method of forming the structure. By cladding the tantalum pentoxide ($Ta_2O_5$) layer with silicon nitride layers on both sides, the tantalum pentoxide is trapped and difflusion of tantalum is prevented. The high dielectric properties of the tantalum pentoxide are retained.

One of the main problems experienced with conventional oxides is the diffusion of tantalum out of the $Ta_2O_5$ layer upon subsequent heatings of the device during manufacture. The invention solves this problem by cladding the tantalum pentoxide layer with silicon nitride diffusion barrier layers on both sides, to prevent diffusion of the tantalum without degrading the dielectric properties of the composite structure.

In capacitors, such as polycrystalline silicon-oxide-polycrystalline silicon (hereinafter, polycrystalline silicon is referred to as "polysilicon") or metal-oxide-metal (MOM) a high dielectric constant k is desired.

With conventional oxides such as SiO, WN, and WSiN, tantalum pentoxide tends to exhibit poor heat stability. Sandwiching the $Ta_2O_5$ layer between two layers of SiN, according to the invention, substantially eliminates the heat sensitivity problem. Thus, the combined SiN/$Ta_2O_5$/SiN structure can be used in various applications where heat sensitivity is an important factor.

One of the other benefits of the integrated circuit fabrication method and structure of the present invention is its high dielectric constant (k). Since, SiN has a higher dielectric constant (k=2.9) than conventional oxides such as $SiO_2$ (k=2.0), the charge storage capability of the capacitor is enhanced.

Further, the invention provides improved thermal stability compared to conventional $WN_x$, and $WSiN_x$ structures. Metals tend to break down more quickly than silicon nitride. If tantalum pentoxide is encapsulated with $WN_x$, $WSiN_x$ or TiN structures, and subsequent thermal processing is performed, the properties of the resulting structure would be more temperature sensitive than a $SiN/Ta_2O_5/SiN$ structure according to the present invention.

Thus, the overall dielectric constant of an integrated circuit including the $SiN/Ta_2O_5/SiN$ structure is higher than conventional structures. As is well known in the art, a higher dielectric constant provides better capacitance characteristics. In addition, improved thermal stability is provided by the invention.

In the embodiments described below with reference to FIGS. 1–5, reference is frequently made to the silicon nitride composition as SiN, for the sake of brevity only. In each of the embodiments described below, the silicon nitride cladding may be formed of other compositions of silicon and nitrogen having the form $Si_xN_y$. Thus, the insulating structure according to the invention may more generally be represented as $Si_xN_y/Ta_2O_5/Si_xN_y$.

Although the embodiments described below with reference to FIGS. 1–5 all include only a single insulating layer of tantalum pentoxide between the two silicon nitride layers, the insulating layer between the two silicon nitride layers may include additional layers. For example, a bi-layer or tri-layer dielectric structure having at least one tantalum pentoxide layer may be sandwiched between the two silicon nitride layers. Such structures are contemplated within the scope of the present invention.

FIG. 1 shows a first embodiment of the present invention wherein the insulating structure is included in a metal-oxide-metal (MOM) capacitor structure 100. The capacitor 100 has a central insulating portion 130, surrounded on both sides by first and second electrode layers 120 and 140, respectively.

The central insulating portion 130 includes a layer 132 of tantalum pentoxide ($Ta_2O_5$) sandwiched between silicon nitride ($SiN_xN_y$) layers 131 and 133. The silicon nitride layers 131 and 133 may each be at least about 50 Angstroms thick. The tantalum pentoxide layer 132 may be at least about 100 Angstroms thick. As explained above, the silicon nitride layers 131 and 133 provide a higher dielectric constant than other dielectrics such as silicon dioxide ($SiO_2$), tungsten nitride (WN), or tungsten silicon nitride (WSiN), and also provides excellent thermal stability.

The first electrode structure 120 may include metal, such as, for example, a first layer 121 of aluminum (Al) and a second layer 122 of TiN. The first electrode 120 may be formed of other materials, such as W, Mo, TiW, Pt, WN, MoN, TiWN, WSi, WSiN and the like, instead of TiN. Alternatively, a conductive material such as polysilicon may be used.

The second electrode 140 may be a layer of metal, and may include a single layer of titanium nitride (TiN) 141. It is also acceptable to use W, Mo, TiW, Pt, WN, MoN, TiWN, WSi, WSiN and the like, instead of TiN as the upper electrode metal. Alternatively, a conductive material such as polysilicon may be used.

Figure 2:
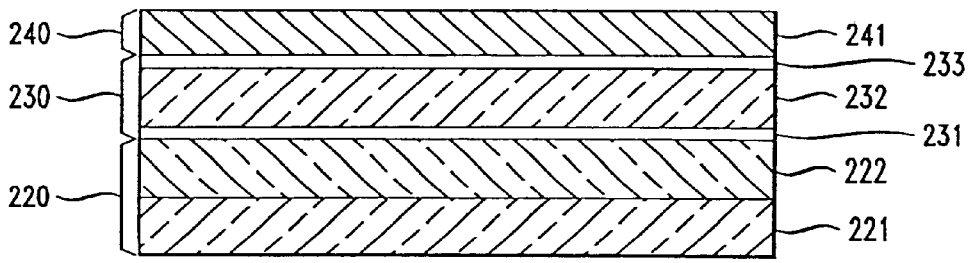
FIG. 2 illustrates a second exemplary device including an insulating structure according to the invention, wherein the device is a metal-oxide-polysilicon (MOP) capacitor.

FIG. 2 shows a second embodiment of the present invention wherein the insulating structure is included in a metal-oxide-polysilicon (MOP) capacitor 200. This second embodiment is similar to the capacitor of FIG. 1. The main difference is that in capacitor 200, the first electrode layer 220 includes a layer of TiN 222 sandwiched between a polysilicon layer 221 and the central oxide portion 230.

The first electrode 220 of capacitor 200 includes a polysilicon layer 221 and a TiN layer 222. The insulating structure 230 includes a first silicon nitride layer 231, a tantalum pentoxide layer 222, and a second silicon nitride layer 223. The second electrode 240 may include a layer of TiN. It is also acceptable to use other materials, such as W, Mo, TiW, Pt, WN, MoN, TiWN, WSi, WSiN and the like, or polysilicon, instead of TiN as the material for the first and/or second electrodes 220 and 240.

Figure 3:
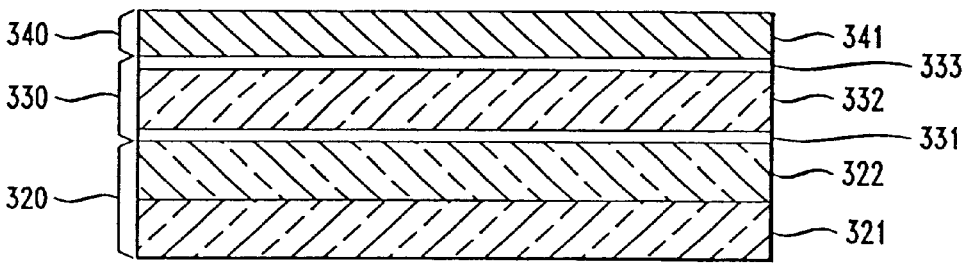
FIG. 3 illustrates a third exemplary device including an insulating structure according to the invention, wherein the device is a polysilicon-oxide-silicon (POS) capacitor.

FIG. 3 shows a third embodiment of the present invention where the insulating structure is included in a polysilicon-oxide-silicon (POS) capacitor 300. Capacitor 300 is similar to the capacitor of FIG. 1, except that the first electrode 320 includes a polysilicon layer 321 having an $SiO_2$ difflusion barrier layer 322 formed thereon, and the second electrode 340 includes a polysilicon layer 341.

The first electrode 320 of capacitor 300 includes a polysilicon layer 321 and an $SiO_2$ difflusion barrier layer 322. The insulating structure 330 includes a first silicon nitride layer 331, a tantalum pentoxide layer 322, and a second silicon nitride layer 323. The second electrode 340 may include a layer 441 of polysilicon. It is also acceptable to use other materials, such as W, Mo, TiW, Pt, WN, MoN, TiWN, WSi, WSiN and the like, instead of polysilicon as the material for the first and/or second electrodes 320 and 340.

Figure 4:
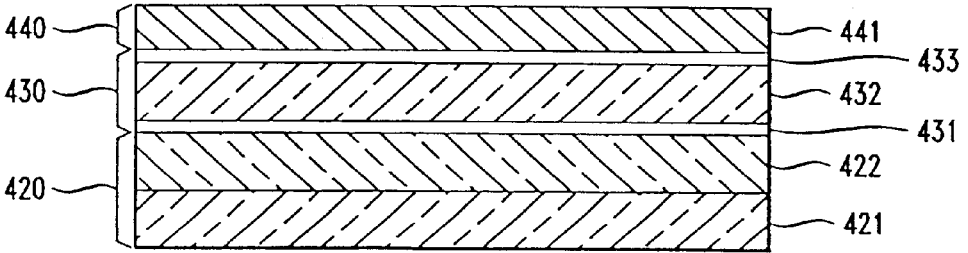
FIG. 4 illustrates a fourth exemplary device including an insulating structure according to the invention, wherein the device is a polysilicon-oxide-polysilicon (POP) capacitor.

FIG. 4 shows a fourth embodiment of the present invention where the insulating structure is included in a polysilicon-oxide-polysilicon (POP) capacitor 400. This fourth embodiment is similar to capacitor 300, except that the first electrode layer 420 comprises a layer of TiN 422 sandwiched between a polysilicon layer 421 and the central insulating structure 430.

The first electrode 420 of capacitor 400 includes a polysilicon layer 421 and a TiN layer 422. The insulating structure 430 includes a first silicon nitride layer 431, a tantalum pentoxide layer 422, and a second silicon nitride layer 423. The second electrode 440 may include a layer 441 of polysilicon. It is also acceptable to use other materials, such as W, Mo, TiW, Pt, WN, MoN, TiWN, WSi, WSiN and the like, instead of polysilicon as the material for the first and/or second electrodes 420 and 440.

The exemplary capacitor structures 100, 200, 300, 400 may be formed by modifying conventional fabrication techniques to includes steps for forming the three-layer $Si_xN_y/Ta_2O_5/Si_xN_y$. structure. For example, capacitors may be formed by modifying the fabrication methods of the '623 or '017 patents (both incorporated by reference herein) to add a step of forming a second silicon nitride layer over the tantalum pentoxide layer, before forming the upper electrode layer. In these examples, appropriate thickness is used for the two silicon nitride layers (e.g., about 50 Angstroms) and the tantalum pentoxide layer (e.g., about 100 Angstroms).

Figure 5:
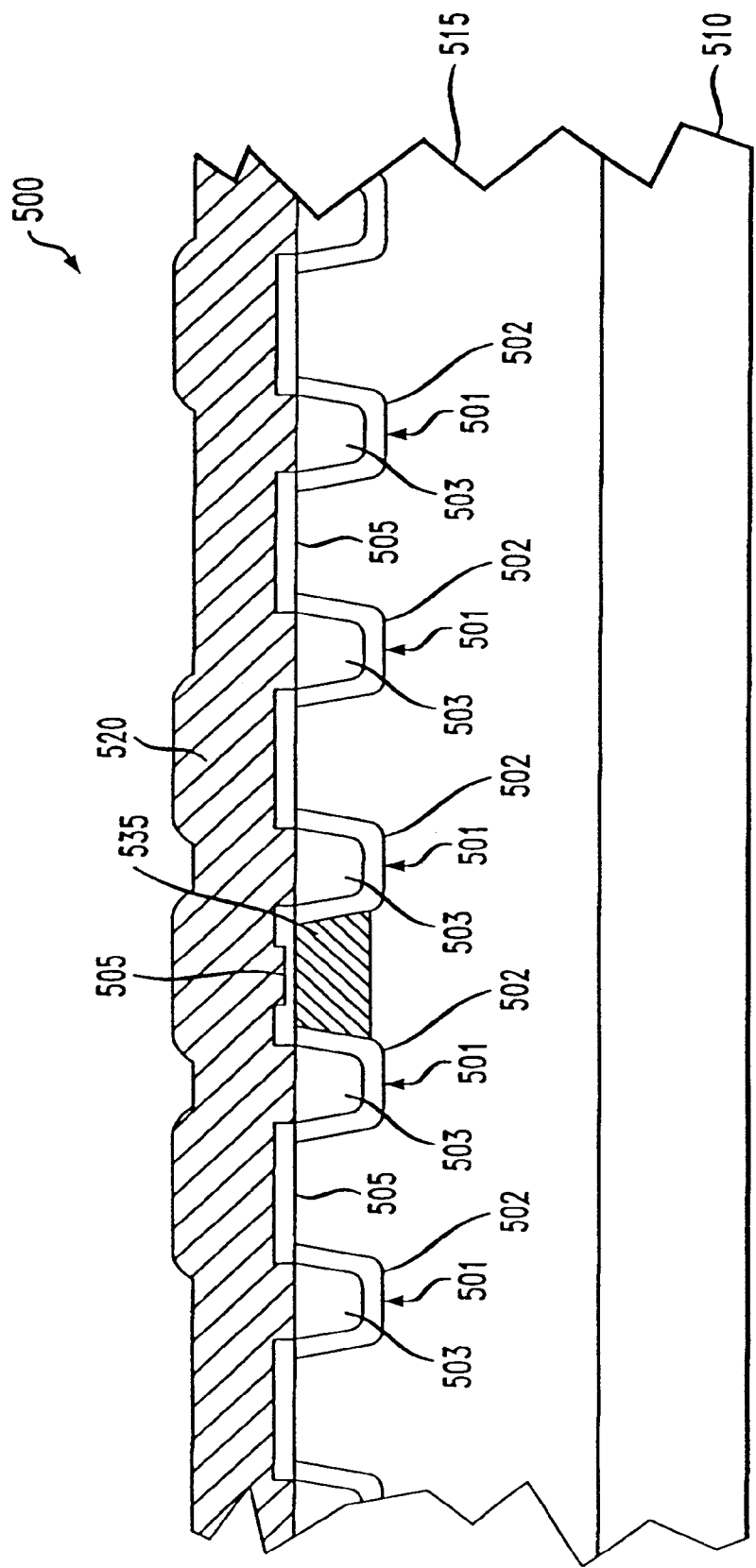
FIG. 5 illustrates an exemplary circuit including an insulating structure according to the invention, wherein the insulating structure is part of a shallow trench isolation structure.

FIG. 5 shows a fifth embodiment of the present invention wherein an integrated circuit configuration 500 includes a shallow trench isolation structure 501. Shallow trench isolation structures are well known in the art for providing isolation between different devices on an integrated circuit substrate. Formation of shallow trench devices is well known in the art. An exemplary method for forming a shallow trench isolation structure is described in U.S. Pat. No. 5,854,114 to Li et al., (hereinafter, "the '114 patent") which is incorporated by reference herein in its entirety.

The shallow trench isolation structure 501 shown in FIG. 5 includes a liner 502 which is substantially similar to the three-layer SiN/Ta$_2$O$_5$/SiN composite structure described above with reference to FIGS. 1–4.

The shallow trench isolation structure 501 may include a silicon substrate 510 and an epitaxial silicon layer 515. Shallow trenches are formed in the surface of epitaxial layer 515, by a conventional process. The SiN/Ta$_2$O$_5$/SiN liner 502 is formed on the side and bottom surfaces of the shallow trenches. The lined trenches are then filled with an oxide such as tetraeythylorthosilicate (TEOS) 503. A polysilicon layer 520 is formed over the TEOS 503. The other devices in the configuration 500 may be the same as shown and described in the '114 patent, including a thin tunnel oxide 505 and a programming junction implant 535.

The fabrication method of the exemplary circuit configuration 500 may be similar to that described in the '114 patent, except that the liner oxide layer 120 in the '114 patent is replaced by the SiN/Ta$_2$O$_5$/SiN liner structure 502 in FIG. 5 of this application. Thus, all of the fabrication steps of the '114 patent may be followed, except for the step of forming the liner oxide 120.

A shallow trench isolation structure according to the invention has the SiN/Ta$_2$O$_5$/SiN liner structure. One of ordinary skill recognizes that shallow trench isolation configurations other than that shown in the '114 patent may be formed with a SiN/Ta$_2$O$_5$/SiN liner structure according to the present invention, and the shallow trench isolation structures may be used between any variety of active devices.

Although the invention has been described in terms of exemplary embodiments, it is not limited thereto. Rather, the appended claim should be construed broadly, to include other variants and embodiments of the invention which may be made by those skilled in the art without departing from the scope and range of equivalents of the invention.

What is claimed is:

1. An insulating structure comprising:

a first silicon nitride layer;

a second silicon nitride layer separate from the first silicon nitride layer; and a tantalum pentoxide layer between the first and second silicon nitride layers, wherein the insulating structure is a liner structure of a shallow trench isolation region.

2. A shallow trench isolation structure, comprising:

a substrate having a shallow trench on a surface thereof, the shallow trench having a bottom surface and a side surface, the shallow trench being located between two devices on the substrate;

a first silicon nitride layer formed on the bottom and side surfaces of the shallow trench;

a second silicon nitride layer above the first silicon nitride layer;

a tantalum pentoxide layer between the first and second silicon nitride layers; and an oxide layer formed on the second silicon nitride layer.

3. The shallow trench isolation structure of claim 2, wherein the oxide layer contains tetraeythylorthosilicate.

4. The shallow trench isolation structure of claim 2, wherein the first and second silicon nitride layers are at least about 50 Angstroms thick.

5. The shallow trench isolation structure of claim 2, wherein the tantalum pentoxide layer is at least about 100 Angstroms thick.

* * * * *